US009860646B2

(12) United States Patent
Bagshaw et al.

(10) Patent No.: US 9,860,646 B2
(45) Date of Patent: Jan. 2, 2018

(54) TRANSDUCER FOR ACOUSTIC COMMUNICATIONS

(71) Applicant: BAE SYSTEMS plc, London (GB)

(72) Inventors: John Martin Bagshaw, Chelmsford (GB); Lionel William John Kent, Chelmsford (GB); Christophe Arthur Paul Boulet, Chelmsford (GB)

(73) Assignee: BAE Systems plc, London (GB)

( * ) Notice: Subject to any disclaimer, the term of this patent is extended or adjusted under 35 U.S.C. 154(b) by 731 days.

(21) Appl. No.: 14/352,824

(22) PCT Filed: Oct. 17, 2012

(86) PCT No.: PCT/GB2012/052558
§ 371 (c)(1),
(2) Date: Apr. 18, 2014

(87) PCT Pub. No.: WO2013/057481
PCT Pub. Date: Apr. 25, 2013

(65) Prior Publication Data
US 2014/0269210 A1    Sep. 18, 2014

(30) Foreign Application Priority Data

Oct. 18, 2011   (GB) .................................. 1118006.4

(51) Int. Cl.
*H04R 17/00* (2006.01)
*H04B 11/00* (2006.01)
(Continued)

(52) U.S. Cl.
CPC ........... *H04R 17/00* (2013.01); *B06B 1/0215* (2013.01); *H04B 11/00* (2013.01); *H01L 41/0825* (2013.01)

(58) Field of Classification Search
USPC ........................................................ 367/140
See application file for complete search history.

(56) References Cited

U.S. PATENT DOCUMENTS 4,016,512 A * 4/1977 Wauk, II ........................ 333/143
4,099,147 A * 7/1978 McAvoy ........................ 333/143
(Continued)

FOREIGN PATENT DOCUMENTS

| EP | 2293469 A1 | 3/2011 |
| WO | 2008075092 A1 | 6/2008 |
| WO | 2013057481 A1 | 4/2013 |

OTHER PUBLICATIONS

S.H. Lee, K. H. Yoon, J. K. Lee. "Influence of electrode configurations on the quality factor and piezoelectric coupling constant of solidly mounted bulk acoustic wave resonators" Journal of Applied Physics 92, 4062-9 (2002).*
(Continued)

*Primary Examiner* — James R Hulka
(74) *Attorney, Agent, or Firm* — Finch & Maloney PLLC

(57) ABSTRACT

There is disclosed herein a transducer for acoustic communications through a series arrangement of fluid and solid media, the transducer comprising: —a signal processor configured to implement a communications scheme at and around a center frequency of at least 1 MHz; a piezoelectric element for activation in accord with the communications scheme; an electrode electrically connected to the signal processor, and being attached to the piezoelectric element; and a substrate, having the piezoelectric element mounted thereon, wherein an aspect of the electrode at the piezoelectric element is approximately equal to the acoustic wavelength of an acoustic wave in the substrate at the center frequency. There is further disclosed a remote monitoring device employing at least one of the transducers described, in concert with a further transducer. Still further, there is disclosed a method of communicating using the transducer described herein.

21 Claims, 11 Drawing Sheets

(51) Int. Cl.
*B06B 1/02* (2006.01)
*H01L 41/08* (2006.01)

(56) References Cited

U.S. PATENT DOCUMENTS

| | | | |
|---|---|---|---|
| 4,242,653 A | 12/1980 | Moore | |
| 4,316,161 A * | 2/1982 | Moore et al. | 333/141 |
| 4,356,421 A | 10/1982 | Shimizu et al. | |
| 4,523,122 A | 6/1985 | Tone et al. | |
| 4,945,539 A * | 7/1990 | Bagshaw et al. | 372/13 |
| 5,181,013 A * | 1/1993 | Bagshaw et al. | 345/4 |
| 6,037,704 A * | 3/2000 | Welle | 310/339 |
| 6,400,648 B1 * | 6/2002 | Heijnsdijk et al. | 367/152 |
| 6,752,763 B2 | 6/2004 | Erikson | |
| 7,894,306 B2 * | 2/2011 | Bagshaw et al. | 367/137 |
| 2003/0120153 A1 * | 6/2003 | Erikson | 600/447 |
| 2005/0093399 A1 | 5/2005 | Inoue | |
| 2005/0207589 A1 | 9/2005 | Biegelsen | |
| 2006/0014451 A1 * | 1/2006 | Muller | 442/6 |
| 2010/0061188 A1 * | 3/2010 | Bagshaw et al. | 367/137 |
| 2012/0155221 A1 * | 6/2012 | Bagshaw et al. | 367/137 |
| 2015/0303895 A1 * | 10/2015 | Ballandras | H01L 41/047 310/313 R |
| 2016/0022244 A1 * | 1/2016 | Courtney | A61M 25/0045 600/466 |

OTHER PUBLICATIONS

International Preliminary Report on Patentability received for Patent Application No. PCT/GB2012/052558, dated May 1, 2014, 7 pages.
International Search Report and Written Opinion received for Patent Application No. PCT/GB2012/052558, dated Jan. 23, 2013, 11 pages.
GB Intellectual Property Office Search Report under Section 17(5) received for GB Patent Application No. 1118006.4 dated Feb. 13, 2012, 4 pages.
Salgar, et al., "Modeling and Simulation of the Thin Film Bulk Acoustic Resonator", IEEE International Frequency Control Symposium and PDA Exhibition, Dec. 16, 2002, pp. 40-44.

* cited by examiner

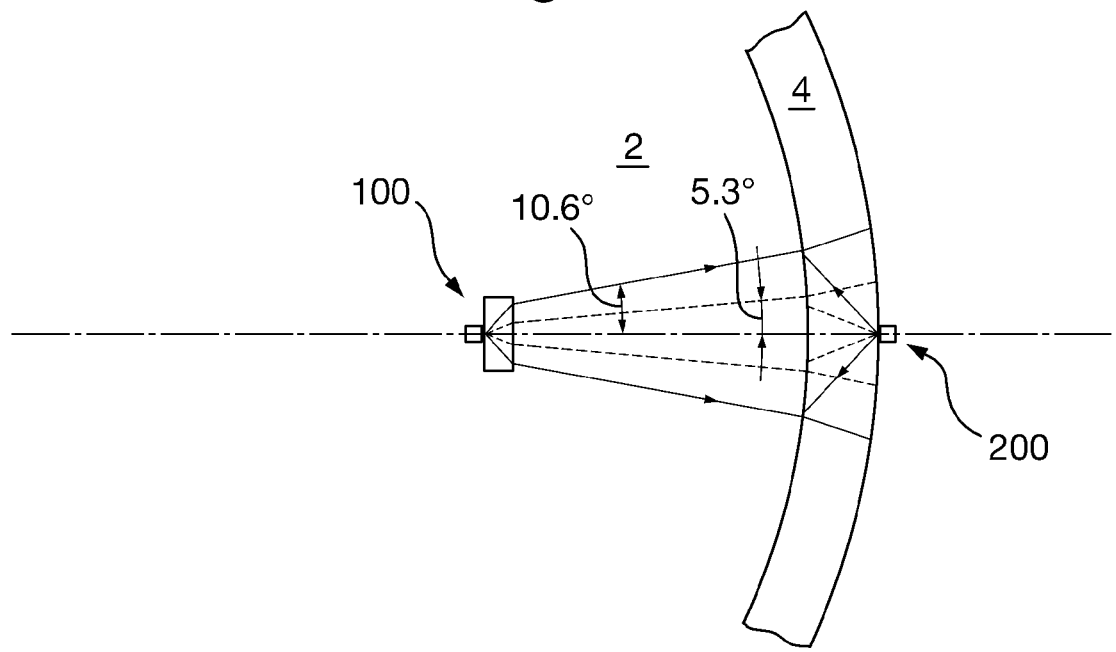
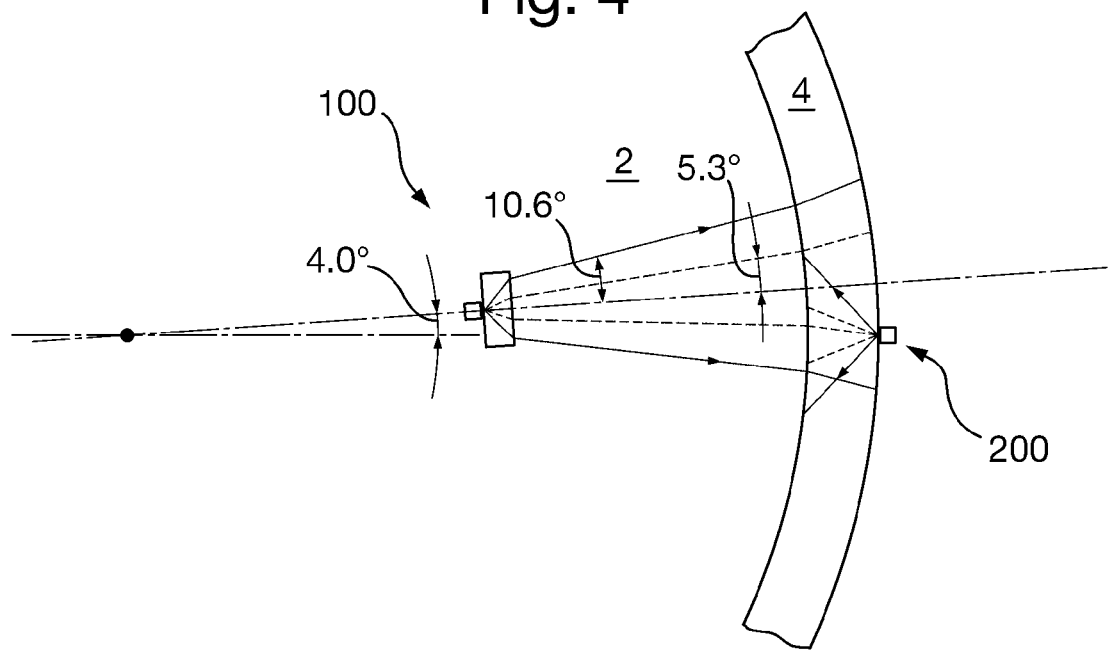

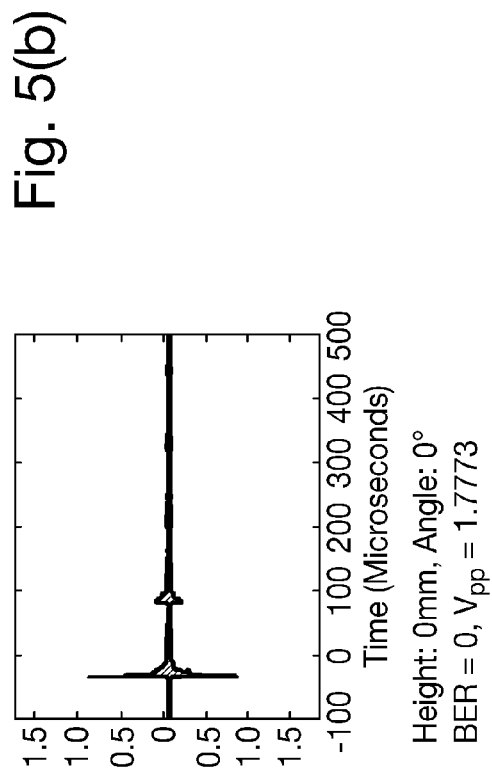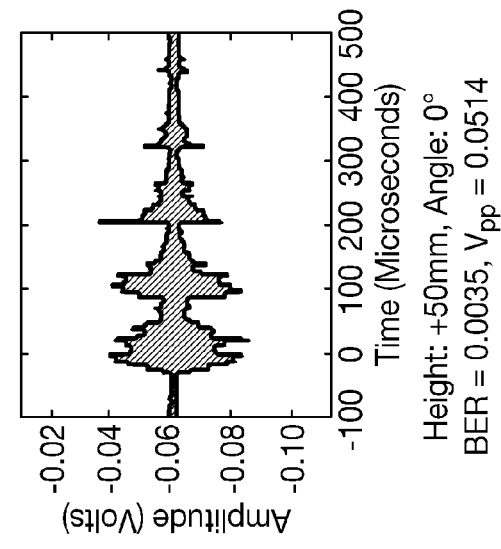
Fig. 5(a)  Fig. 5(b)  Fig. 5(c)  Fig. 5(d)

2.7mm Electrode Pair
Height: 0mm, Angle 13°

3.2mm Electrode Pair
Height: 0mm, Angle 13°

TRANSDUCER FOR ACOUSTIC COMMUNICATIONS

The following invention relates to a transducer for acoustic communications, to a remote monitoring device comprising such a transducer and to a method of communications through a vessel or conduit.

Various acoustic communications systems are known which provide a pair of transducers for passing data through a medium. In general a transmitting transducer for generating and modulating acoustic waves is provided on a first surface of a medium and a receiving transducer for converting the acoustic waves to an electric signal is provided on an opposing surface of the medium. Often the medium is a homogeneous material such as steel.

Typically, to achieve suitable interference-free signal strength at the receive transducer, i) the acoustic waves generated by the transmit transducer form a highly collimated beam and ii) paired transducers are positioned such that they are aligned (i.e. the boresight of one transducer projects onto the boresight of the other) with each other with significant precision.

According to a first aspect of the present invention there is provided a transducer for acoustic communications through a series arrangement of fluid and solid media, the transducer comprising: —a signal processor configured to implement a communications scheme at and around a centre frequency of at least 1 MHz; a piezoelectric element for activation in accord with the communications scheme; an electrode electrically connected to the signal processor, and being attached to the piezoelectric element; and a substrate, having the piezoelectric element mounted thereon, wherein a dimension of the electrode at the piezoelectric element is approximately equal to the acoustic wavelength of an acoustic wave in the substrate at the centre frequency.

Such a transducer tends to transmit, over a relatively wide angle, a signal that remains of sufficient intensity to be interpreted upon reception. For example, the wide angle may be an 8° field of view when the acoustic signal is coupled from the substrate into a fluid. The dimension of the electrode at the piezoelectric element will in general be the width or breadth of the face of the electrode contacting the piezoelectric element.

As such the transducer enables a signal to be acoustically sent or received where it is not possible to precisely align a transmitting transducer with a counterpart receiving transducer.

A pair of the present transducers, a first arranged to transmit data, a second to receive data, may be arranged at a liquid-carrying pipe such that the first transducer is within the flow and the second is on the outside of the pipe wall. Thus the transducers may enable communication between a generally central region in the pipe and an external region of the pipe where precise alignment of the transducers is not feasible. For the second transducer, mounted on the pipe wall, the pipe wall may act as the substrate.

The combination of the piezoelectric element and the electrode provides an acoustic aperture device where the piezoelectric element will tend to generate longitudinal acoustic waves when activated by the electrode. The provision of the substrate, through which longitudinal acoustic waves may initially propagate prior to subsequent transmission into the fluid medium, can enhance the transmission of acoustic power into the fluid over a wide frequency bandwidth. The substrate may for example be a steel plate.

For example, the transmission tends to be enhanced because the substrate can tend to provide an improved acoustic impedance match. That is to say the match between the piezoelectric element, the substrate and the fluid would be better than that between the element and the fluid alone. As such, mechanical power is more efficiently coupled out of the transducer thus increasing the coupling efficiency over a wide bandwidth.

This coupling is greater than that suggested from modelling an equivalent transducer lacking a substrate.

Also, the provision of a substrate will tend to partially encapsulate the transducer from the environment. Thus the substrate tends to reduce the further provisions which may need to be made in order to fully encapsulate the transducer to protect the electronics from the environmental conditions. Indeed, the substrate may have the form of a housing which extends around the entire transducer structure to provide encapsulation.

The provision of a 1 MHz or greater centre frequency can enable a useful bit rate data stream to be relayed by the transducer. In particular the bit rate data stream maybe ~20 kbps, which rate is sufficient to convey control data for actuated machinery. A ~20 kbps bit rate may be equivalent to a 39 kHz raw physical layer rate. Such a relatively high bit rate may be surprising given the transmission losses to which a transducer may be exposed in the fluid/solid medium environment, and given the various likely reflections and refractions.

Further, the selection of such a relatively high centre frequency can enable relatively small electrodes and piezoelectric elements (i.e. a smaller acoustic aperture) which can enable a more compact transducer design.

Still further, a relatively high centre-frequency such as 1 MHz can tend to provide a relatively large acoustic attenuation, which in turn improves the latency of the system. In particular, the larger the acoustic attenuation, the less time it takes for multi-path signals to become negligible. Thus the larger the acoustic attenuation, the less the latency of the system.

The communications scheme may be a Coded Orthogonal Frequency Division Multiplexing (COFDM) scheme.

As such, the scheme can provide for communications with a reduced susceptibility to error in the presence of, for example, interference or multipath effects.

The use of a COFDM scheme tends to facilitate data transmission at useful rates (such as 20 kbps) and at considerable angular displacements. COFDM overcomes multi-path signal interference by transmitting the data in a set of parallel streams of long period data 'symbols' via a comb of closely spaced frequency carriers. The period of these symbols is set to be longer than the spread in the relative time of arrival of the 'significant' multi-path signals. In this context 'significant' relates to signals whose power is greater than approximately −20 dB relative to the strongest multi-path (or direct path) signal.

Further, a guard period of the COFDM scheme can be configured to allow multi-path signals to contribute to the assessment of which data has been received. For example where the transducer is for installation within a pipe and for communication outside the pipe, the guard period can be calibrated to admit significant multipath signals arising from reflections within the pipe wall.

Data may be represented on each lower bit rate channel using binary phase shift keying (BPSK). Alternatively, other types of phase shift keying may be used.

Thus COFDM tends to enable the transducer 100 to transmit data reliably over a signal channel that is subject to multi-path signals with different times of arrival, the multipath signals tending to interact to produce signal interference. Such multi-path signals arise from reflections at acoustically impedance mismatched interfaces such as those defined between a fluid and solid medium. COFDM is described for example by S. Haykin in Communications Systems, 4th Edition, publisher John Wiley & Sons Inc, 2001.

Under the COFDM scheme, the transducer will tend to apply a Forward Error Correction (FEC) to the transmitted data.

By applying such a correction scheme, a signal which upon arrival at a receiver has a Bit Error Rate of up to 10% may be used to reconstruct the originally transmitted data. This can allow greater offsets to be accommodated without compromising the communications link. For example where a transducer transmits at a 3.5 MHz centre-frequency, offset angles of up to at least ±28° or at height offsets of up to at least 100 mm may be accommodated and a raw physical layer rate of 39 kHz may be relayed and/or received by the transducer which may be translated into a 19.5 kbps logical channel data rate.

The piezoelectric element of the transducer tends to generate longitudinal acoustic waves. Longitudinal acoustic waves cannot generally be transmitted through a liquid and into a solid such as steel at angles greater than approximately 15°. However at such angles and beyond, acoustic mode conversion of the incident longitudinal wave at the liquid/solid interface can result in acoustic wave mode conversion at the interface such that shear waves are generated and transmitted onwards. A mode conversion of the shear waves following a reflection at another interface (e.g. a substrate to piezoelectric interface) can result in the regeneration of a longitudinal polarised wave, which the piezoelectric element of a further transducer may receive.

Accordingly, where COFDM communications schemes are implemented, the substrate may be shaped to promote acoustic wave mode conversion, and particularly the conversion of longitudinal waves incident at 10° or more to the boresight of the piezoelectric element.

Such shaping could provide a curved or domed substrate. Additionally or alternatively, the surface of the substrate may be provided with surface relief patterning to promote such mode conversion.

The use of a COFDM signal modulation scheme and Forward Error Correction can accommodate the increased signal multipath complexity that occurs with such mode conversion.

The transducer may further comprise a matching circuit electrically interposed between the signal generator and the piezoelectric element.

A matching circuit can tend to improve the operational bandwidth of the system and thus the communications scheme can transmit over a greater number of parallel channels.

The electrically matched piezoelectric element may have an electrical impedance equal to or less than 200Ω.

With a relatively low impedance such as this, and certainly lower compared to e.g. Lithium Niobate piezoelectric elements, for a given level of acoustic power either a lower drive voltage may be applied to the element in order to transmit acoustic waves or greater voltages may be observed at a receiving transducer.

Further, such a piezoelectric element may tend to be compatible with a greater range of electrical interconnects, thereby tending to provide design flexibility in laying out the transducer components. Such design flexibility may lead to a more compact transducer or may, unlike higher impedance equivalents, allow interconnects between the electrodes and further components to extend further to more convenient locations for such components.

Given such an impedance the piezoelectric element may tend to have a relative permittivity of at least 1000.

In general, any piezoelectric material with a relatively high dielectric constant and with an electromechanical coupling coefficient that is greater than approximately 0.1 could be suitable.

In particular, Lead Zirconate Titanate (PZT) has been found by the applicant to have a suitable dielectric constant or relative permittivity. Further, the impedance of PZT is relatively low, for example compared to piezoelectric elements formed from Lithium Niobate.

The electrode may have an area in the range of 4 $mm^2$-16 $mm^2$.

For example, where the substrate is a steel plate (within which the speed of sound is approximately 6000 m/s), these dimensions provide an element that can transmit/receive at a 3-4 MHz centre frequency with a main acoustic diffraction lobe that in the steel substrate extends over a wide angular field of view of up to ±90°.

The electrode may have a generally square shape. A square element may provide a radiation pattern that is similar in, for example, a vertical and horizontal aspect. Alternatively, an elongate rectangular electrode may be chosen where an alignment is more likely in one dimension than another. For example, if a transducer is likely to be horizontally misaligned with its receiver, then the rectangular element should have its longest aspect arranged vertically.

The substrate may have a thickness such that the thickness does not represent an integer ratio of other wall thicknesses in the transducer or solid medium, the thickness thereby mitigating the interference from low-order multi-path signals.

Multi-path signals can tend to arise as a result of reflections in different wall thicknesses within the transducer and media. Such a substrate thickness tuning provision may act as an alternative or a compliment to the interference mitigation provided by the communications scheme. For instance, because COFDM schemes would make use of multipath signals, the substrate tuning would not be expected to be best suited for use in combination with COFDM. However the substrate thickness tuning may find application in combination with other communications schemes such as rake modulation schemes.

A transducer may be provided, further comprising a secondary electrode, and a switch operably connected between the signal processor, the electrode, and the secondary electrode, the switch being operable to select the electrode with which the signal processor communicates.

Providing a further electrode at the piezoelectric element provides further options for establishing a suitable or optimised communications link. The further electrode effects a further acoustic aperture.

Moreover, a transducer may be provided with an array of electrodes (effectively an array of acoustic aperture devices) which may independently affect the phase and amplitude of the signals they transmit. As such, the array may tend function as an acoustic beam steering array.

The secondary electrode may be of substantially different dimensions to an other electrode of the transducer.

The applicant has found that the complexity of a signal received at a second transducer in response to an input pulse transmitted by a first transducer can vary greatly with the size of the transducer electrode. Surprisingly, in some circumstances the larger aperture electrodes, which have the smaller angular field of view, produce the less complex multi-path transmission response. Consequently the electrode pair with the lowest bit error rate (prior to any Forward Error Correction) can vary as an offset or angular misalignment is changed. Thus, the provision of two different electrode sizes can provide the transducer with further options for establishing a link.

The dimensions of the electrodes may differ insofar as the primary electrode is the same shape as the secondary electrode, but larger. Alternatively, the primary electrode may have the same shape and dimensions, but have a different orientation at the mounting surface. For example the primary electrode may be in the form of an elongate |-shaped member but the secondary electrode may be equivalent to the |-shaped member rotated through 90°, i.e. --shaped. With this particular |-shaped and --shaped arrangement, the -- electrode will provide an acoustic aperture where the waves tend to spread vertically (with respect to the orientation on this page), whilst the | electrode will provide an acoustic aperture where the waves tend to spread horizontally (with respect to the orientation on this page).

According to a second aspect of the present invention there is provided a remote monitoring device for a vessel, the vessel defining a cavity for carrying or storing fluid, the remote monitoring device comprising: a first transducer according to the first aspect of the invention mounted within the cavity and operable to transmit an acoustic wave; a second transducer mounted on an external surface of the vessel and operable to receive an acoustic wave, the second transducer being substantially aligned with the first transducer; a power supply unit electrically connected to the first transducer; and a sensor within the cavity and electrically connected to the first transducer.

Thus the internal characteristics of the vessel, for example the behaviour of the fluid, may be directly monitored without the need to penetrate the vessel wall. Further, because the transducer may be configured to effectively transmit through a first fluid medium and then a solid medium, the transducer may be mounted away from the vessel wall and thus the behaviour of the fluid may be monitored at positions within the cavity more remote from e.g. the internal wall of the vessel.

Where they exist, disadvantages associated with mounting a transducer to a concave surface (e.g. the inside of a cylindrical pipe) may also be avoided.

Typically the cavity will be in the form of either a conduit or a reservoir.

Additional first transducers may be mounted within the cavity to provide an internal array of transducers.

Additional second transducers may be mounted at the external surface of the vessel to provide an external array of transducers.

By providing an array of transducers a greater range of misalignments can be tolerated. Given that each transducer provides at least one acoustic aperture device, the array of transducers provides an array of acoustic aperture devices.

A means for selecting the most suitable transducer in the array may be provided.

The internal array may extend over a mounting surface such that the array may communicate with a receive transducer located within a predetermined region on the vessel.

For example, where the vessel is a 500 mm pipe, the predetermined region, which may be referred to as an envelope, may be a 180° radial field of view over an axial length of 100 mm. In other implementations, the predetermined region may be defined as a specific solid angle, for example $2\pi$ steradians.

The mounting surface for the internal array may be provided on an internal member within the vessel.

Typically the internal member could be a pipe within the vessel.

Alternatively or additionally, the external array may extend over a mounting surface such that the array may communicate with a receive transducer located within a predetermined region within the vessel.

The power supply may comprise a generator comprising a turbine means for drawing energy from an ambient fluid flow As such the power storage requirements to provide electrical power to the internal transceivers using a battery are reduced.

Each first transducer may be co-located with a transducer operable to receive an acoustic wave, thereby defining a internal transceiver and Each second transducer may be co-located with a transducer operable to transmit an acoustic wave thereby defining an external transceiver.

As such, duplex communications are provided for between the inside of the vessel and the external environment.

The first transducer and the second transducer may each be provided with a primary and a secondary electrode, the secondary electrodes being the same size as each other. However, the secondary electrodes may be differently sized to the primary electrodes.

Providing a further and/or differently sized set of electrodes provides further acoustic apertures and thus further options for identifying a suitable communications link. The applicant has found that certain sizes of electrode can provide a simpler or stronger signal to a receiving transducer as compared to other sizes of electrode.

Each transducer may be provided with electrodes additional to the primary and secondary electrode.

Moreover, a transducer may be provided with an array of electrodes each of which may be activated independently to affect the phase and amplitude of the signals they transmit. As such, the array may tend function as an acoustic beam steering array.

According to a third aspect of the present invention there is provided a method of communicating between an internal surface of a vessel and an external surface of a vessel, the vessel defining a cavity, the method comprising the steps of:

providing a first transducer according to the first aspect within the cavity;

providing a receive transducer on the outside of the vessel;

receiving a sensor signal at the first transducer;

digitally modulating the signal at the signal processor to provide a data stream;

transmitting the data stream using acoustic waves;

receiving the parallel data streams at the receive transducer;

combining the parallel data streams into a data stream; and de-modulating the data to extract the sensor signal.

The step of digitally modulating the signal may comprise the implementation of a COFDM modulation scheme.

So that the invention may be well understood, at least one embodiment of the invention will now be described with reference to the following figures, of which:

FIG. 3 shows a cross-sectional view of a pipe with a first transducer mounted internally and aligned with a second transducer mounted externally;

FIG. 4 shows a cross-sectional view of a pipe with a first transducer mounted internally and radially misaligned with a second transducer mounted externally;

Figure 5F:
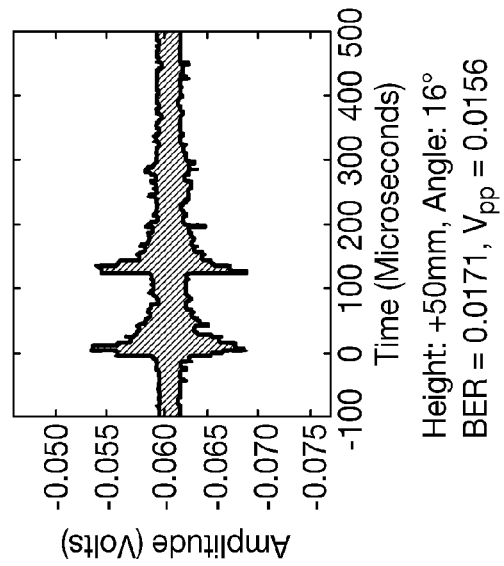
Figure 5H:
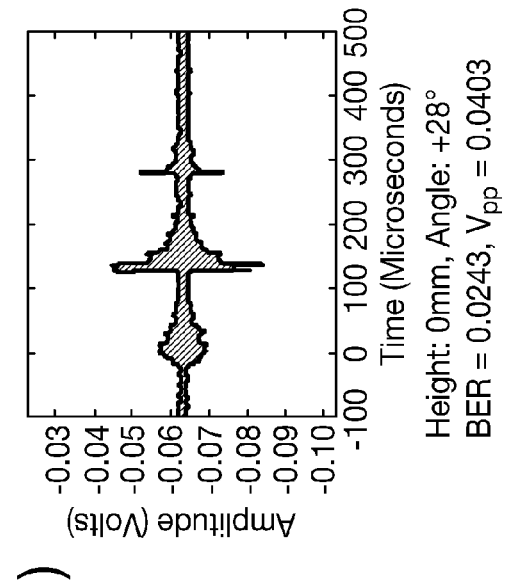
Figure 5E:
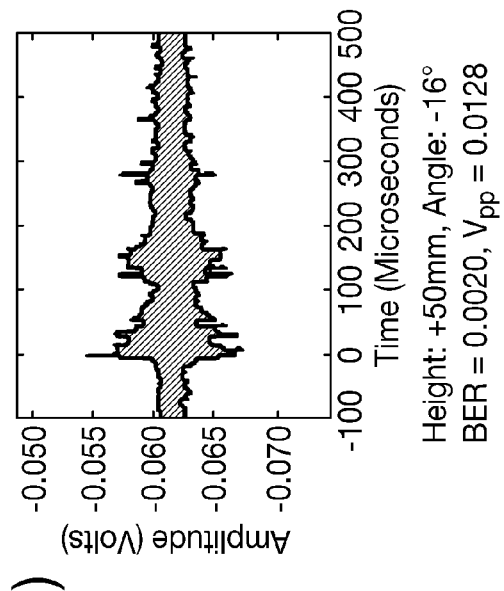
Figure 5G:
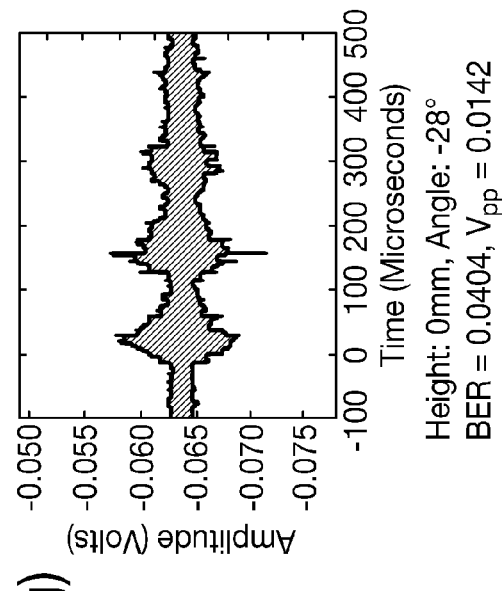
Figure 6:
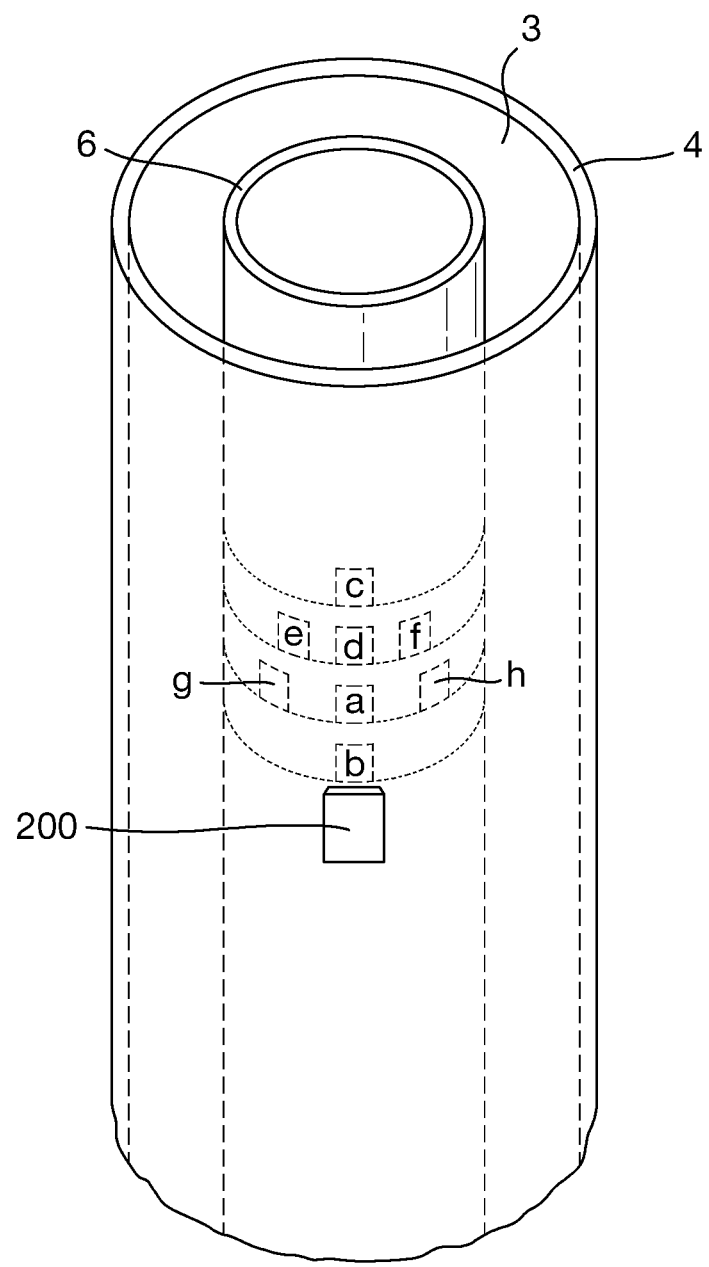
Figure 7:
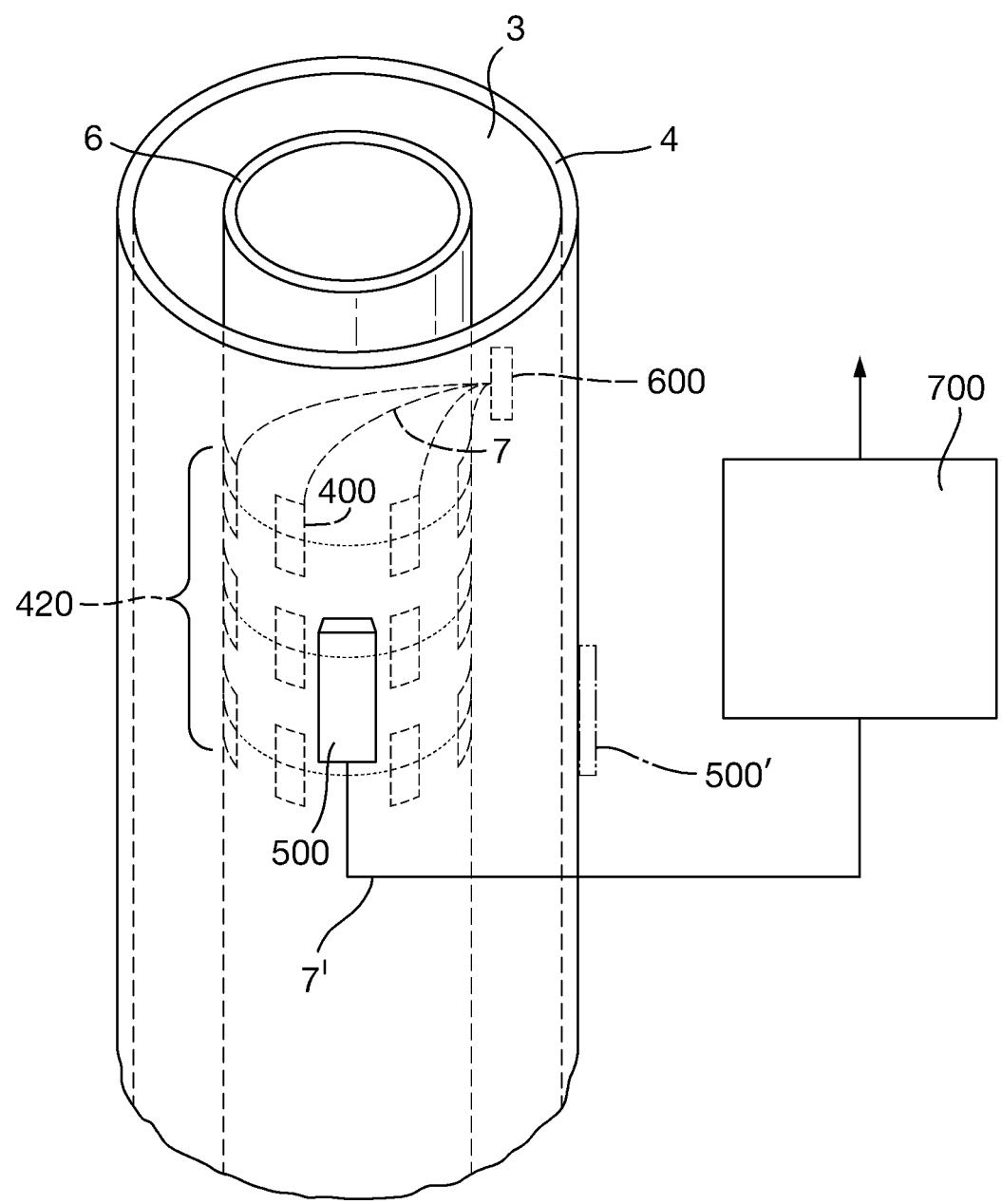
Figure 8:
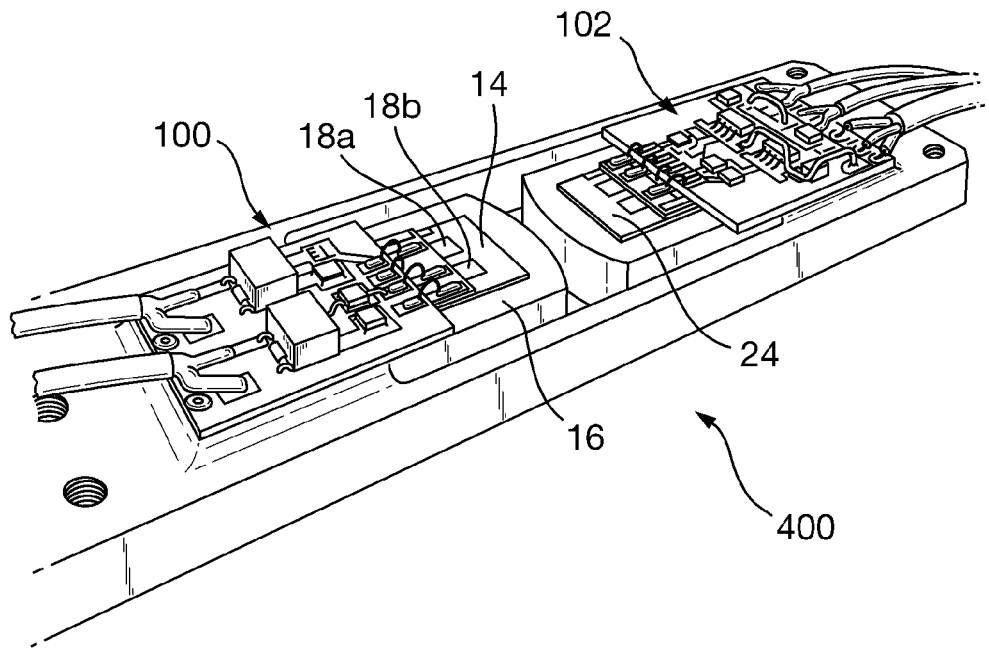
Figure 9:
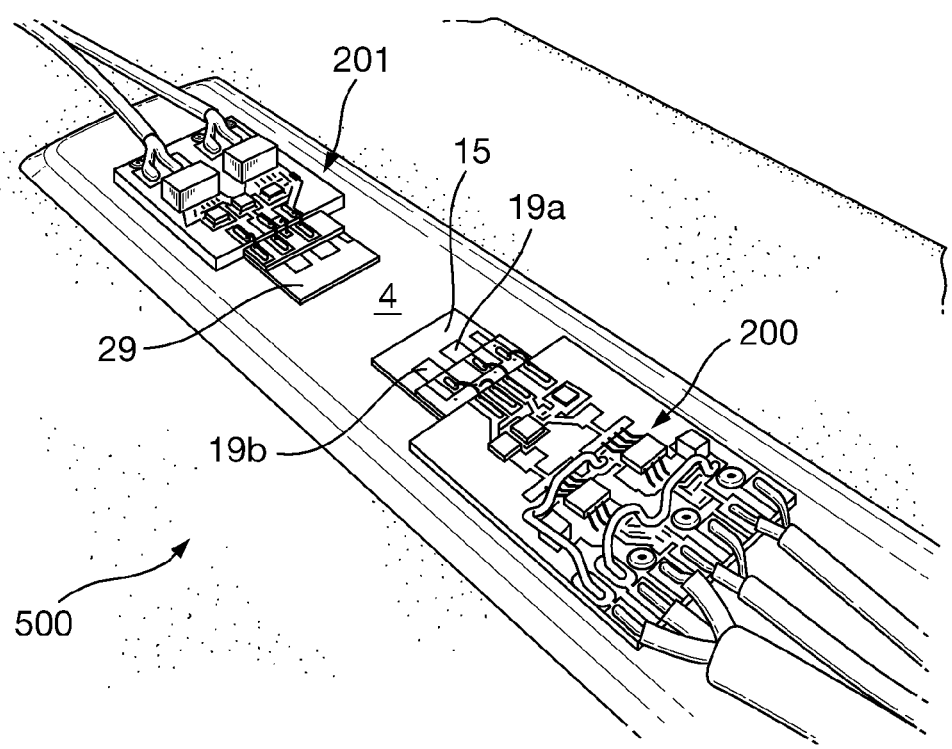
Figure 10:
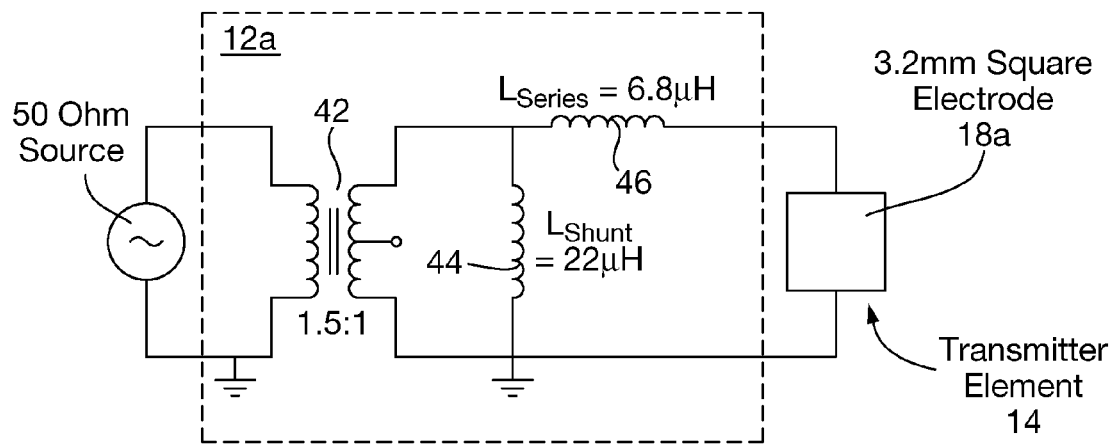
Figure 11:
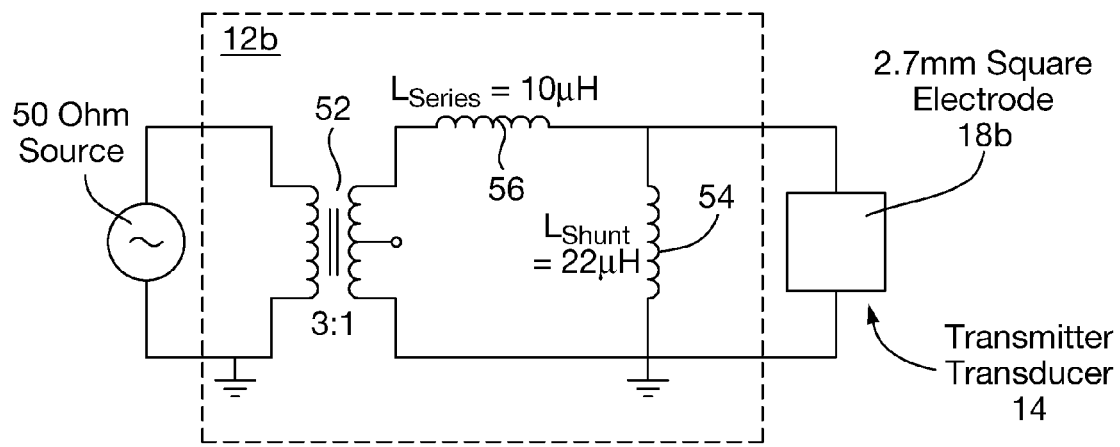
Figure 12:
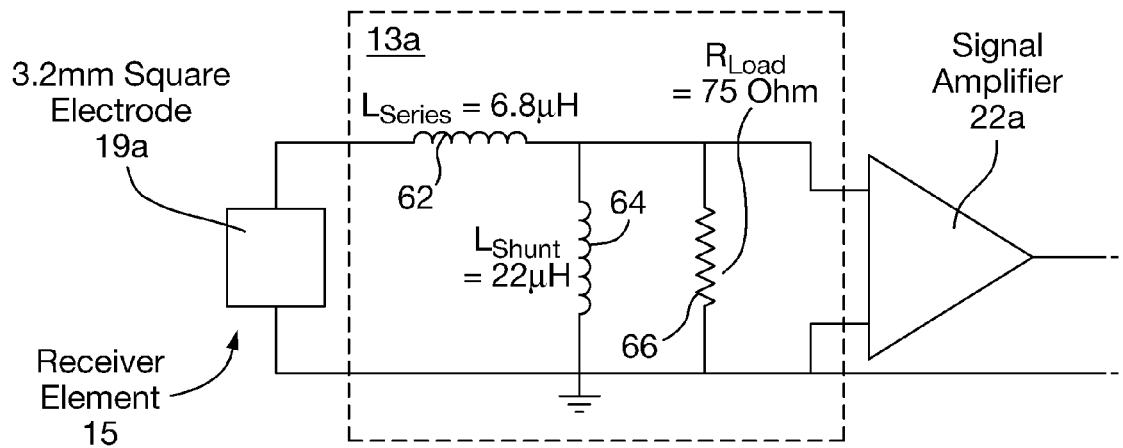
Figure 13:
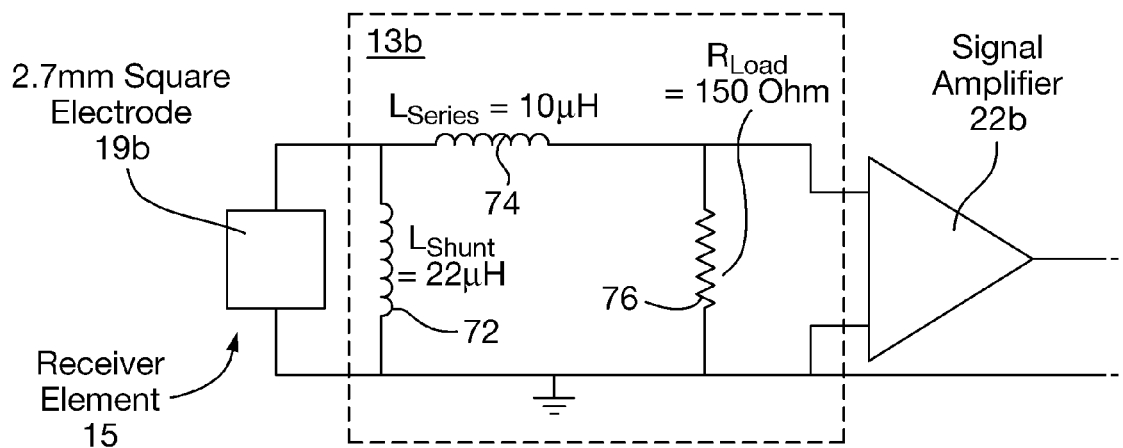
Figure 14A:
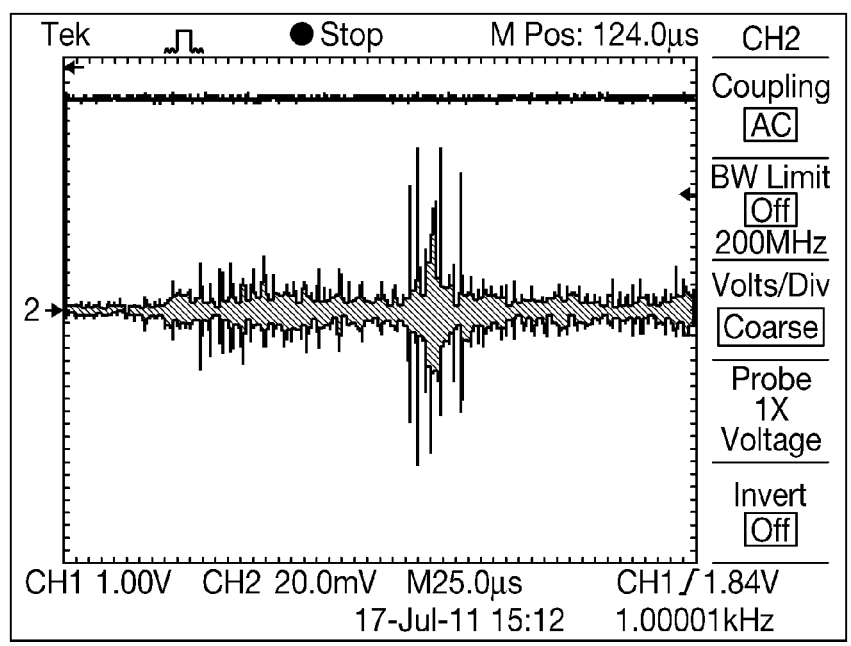
Figure 14B:
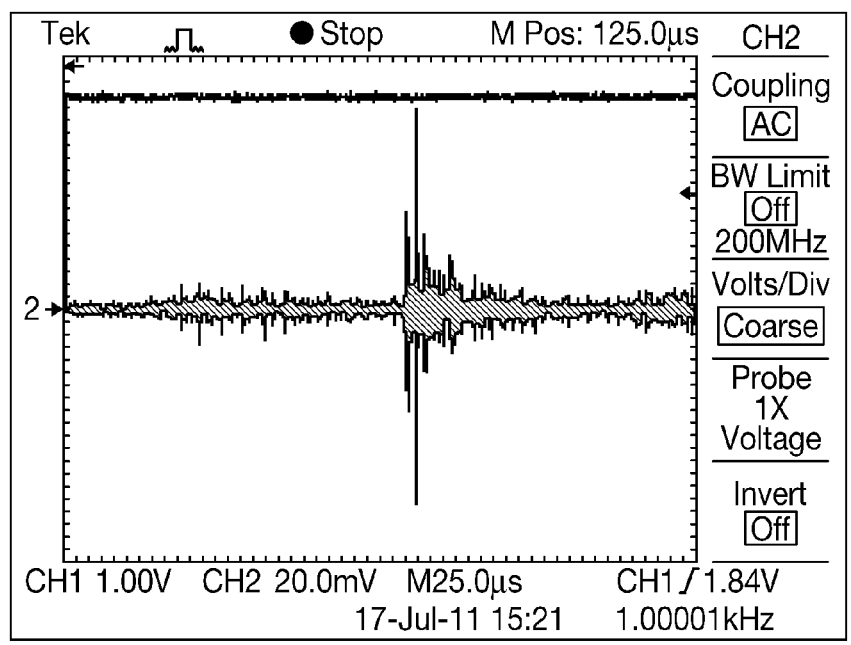

FIGS. 5a-h show impulse response signals as received by a second transducer from a first transducer over various alignments;

FIG. 6 shows an isometric representation of the various alignments from FIGS. 5a-h;

FIG. 7 shows an isometric representation of a remote monitoring device having an array of internal transceivers arranged on an internal pipe and an external transceiver arranged on an outer surface of an external pipe;

FIG. 8 shows an internal transceiver having a dual-electrode transmitting transducer co-located with a dual-electrode receiving transducer;

FIG. 9 shows an external transceiver having a dual-electrode receiving transducer co-located with a dual-electrode transmitting transducer, mounted on an external wall of a pipe;

FIG. 10 shows an electrical matching circuit for a 3.2 mm×3.2 mm square electrode of a transmitter transducer;

FIG. 11 shows an electrical matching circuit 12b for a 2.7 mm×2.7 mm square electrode of a transmitter transducer;

FIG. 12 shows an electrical matching circuit for a 3.2 mm×3.2 mm square electrode of a receiver transducer;

FIG. 13 shows an electrical matching circuit for a 2.7 mm×2.7 mm square electrode of a receiver transducer; and FIGS. 14a and 14b show impulse response signals as received by a second dual-electrode transducer from a first dual-electrode transducer over a given alignment, for a first and second electrode size.

Figure 1:
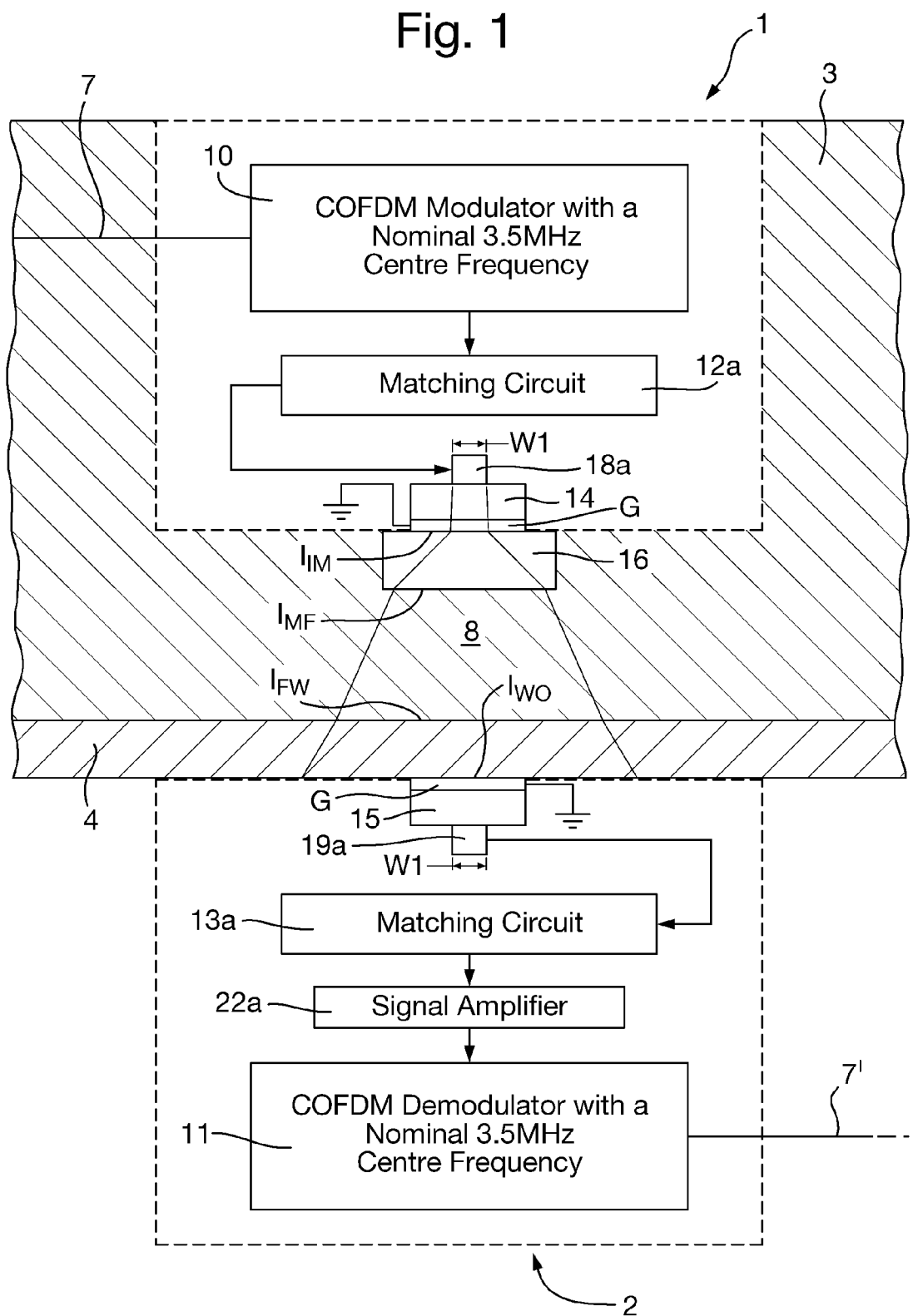
FIG. 1 shows a schematic diagram of a single-electrode first transducer and a single-electrode second transducer, the first transducer being a transmit transducer, the second being a receive transducer, the transducers being positioned to communicate over a fluid and solid medium.

A transducer 1, as shown in FIG. 1, comprises a signal processor for implementing a COFDM modulator 10 and arranged for processing a physical layer input signal 7. The COFDM modulator 10 is connected to a matching circuit 12a and operable to feed a signal into the matching circuit 12a. The matching circuit 12a is in turn connected to, and operable to feed a signal into, an electrode 18a. The electrode 18a, having width W1, is mounted on a first face of a piezoelectric element 14. A ground electrode G is provided on the face of the piezoelectric element 14 opposite the side occupied by the electrode 18a. Thus the ground electrode G is interposed between the piezoelectric element 14 and the substrate 16. The piezoelectric element 14 is mounted by way of the ground electrode G, at a second face opposite the first, on a substrate, i.e. plate 16.

An interface, $I_{IM}$ is defined between the piezoelectric element 14 and the plate 16.

Beyond the plate 16 lies a fluid medium 3, e.g. water in a pipe, and there is an interface $I_{MF}$ defined between the plate 16 and the fluid 3.

In the arrangement shown in FIG. 1, the COFDM modulator 10 is configured to enable the transducer 1 to transmit data.

The transducer 1 is positioned within the fluid medium 3, which is in turn contained within a solid wall 4. The solid wall 4 may be a section of a pipe. The fluid medium 3 may be any liquid used or found or transported in operational industrial environments. An interface $I_{FW}$ is defined between the fluid medium 3 and the solid wall 4.

Further, the transducer 1 is arranged to point through the fluid 3 and wall 4 towards a second transducer 2. The second transducer 2 is mounted onto the external surface of the wall 4 where it defines a wall-to-second-transducer interface $I_{WO}$.

The second transducer 2 is configured to enable the receiving of data and as such comprises a piezoelectric element 15, an electrode 19a having width W1, a matching circuit 13a, a signal amplifier 22a and a processor configured to implement a COFDM demodulator 11, arranged in series. The COFDM demodulator 11 has a nominal centre frequency of 3.5 MHz.

The signal amplifier 22a amplifies an input signal by e.g. 40 dB to provide partial compensation for transmission loss arising as the waves 8 propagate across the fluid 3 and solid 4 media.

The width dimension W1 is selected such that it is approximately equal to the acoustic wavelength of an acoustic wave in the substrate at the centre frequency. Given a steel substrate and a 3.5 MHz centre frequency, the width of the electrode can be approximately 3 mm.

Figure 2:
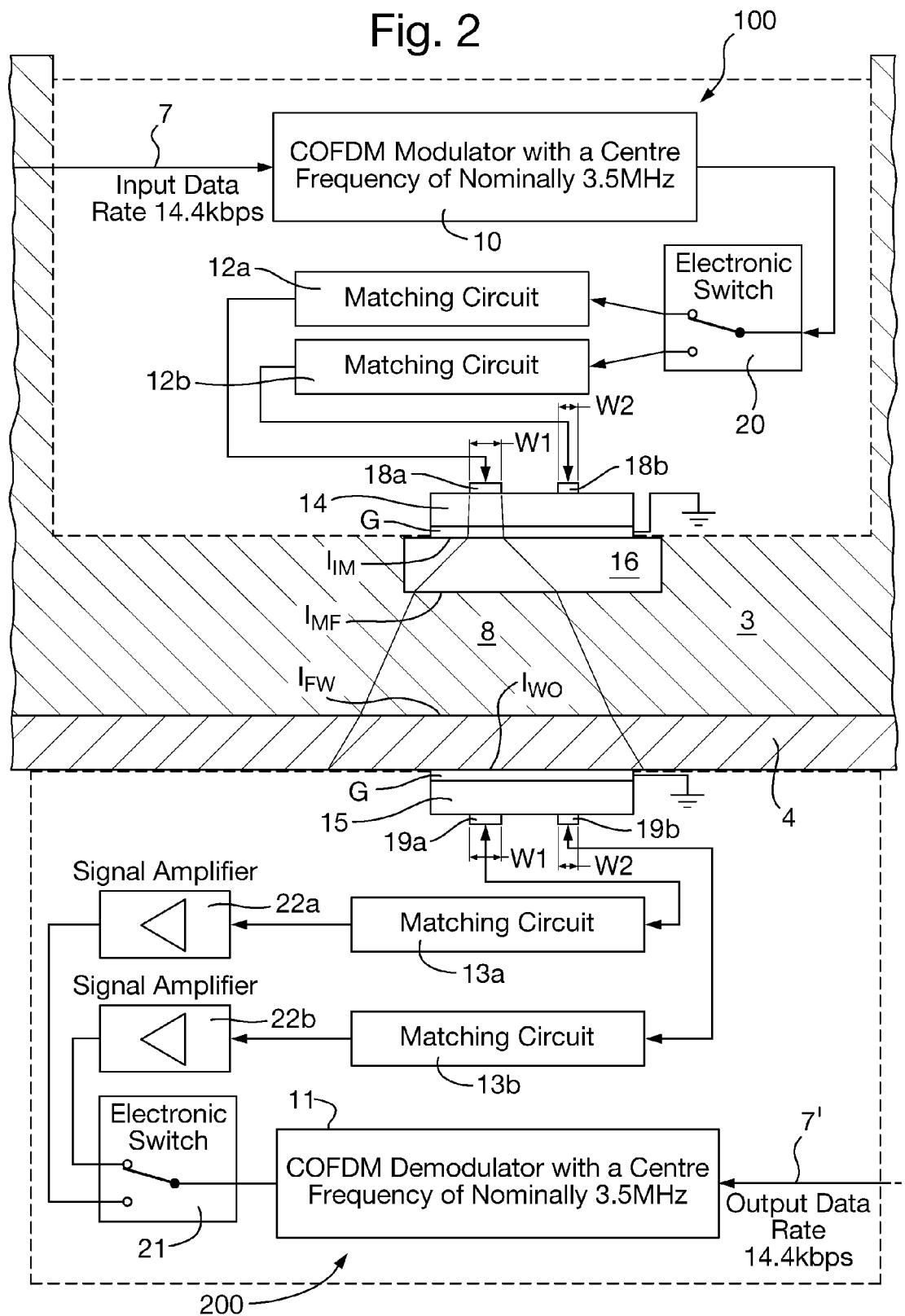
FIG. 2 shows a schematic diagram of a dual-electrode first transducer and a dual-electrode second transducer, the first transducer being a transmit transducer, the second being a receive transducer, the transducers being positioned to communicate over a fluid and solid medium.

An alternative pair of transducers 100 and 200, each of the pair having dual-electrodes and being for a communications link, is shown in FIG. 2.

The alternative transmit transducer 100 is configured to transmit data and is similar to transducer 1 insofar as it comprises a COFDM modulator 10 operably connected to an electrode means for energising a piezoelectric element 14 mounted on a substrate 16; however transducer 100 comprises a plurality of electrodes.

In particular transducer 100 comprises a primary electrode 18a, having width W1, and a secondary electrode 18b, having width W2. These electrodes are bonded at separate locations to a common piezoelectric element 14. The primary electrode 18a and secondary electrode 18b are of different sizes. The primary and secondary transmit electrodes 18a, 18b share a common ground electrode G which is mounted on the opposite face of the piezoelectric element 14 adjacent the plate 16.

The primary electrode 18a is operably connected to a matching circuit 12a, and the secondary electrode 18b is connected to a further matching circuit 12b.

An electronic switch 20 is operably connected to the COFDM modulator 10 and to both of the matching circuits 12a and 12b. The electronic switch 20 is operable to select, at a given time, which of the matching circuits 12a, 12b is to be electrically connected to the output of the COFDM modulator 10. Thus the electronic switch 20 determines which of the electrodes 18a, 18b are in communication with the COFDM modulator 10.

The alternative receive transducer 200 is configured to receive data and is similar to transducer 2 insofar as it comprises means for feeding signals received at a piezoelectric element 15 to a COFDM demodulator 11, those means comprising matching circuitry and signal amplification; however the alternative receive transducer 200 provides a pair of electrodes, primary electrode 19a and secondary electrode 19b bonded to the element 15 at separate locations.

The primary receive electrode 19a has a width W1 and is substantially the same size as the primary transmit electrode 18a. The secondary electrode 19b has a width W2 and is substantially the same size as the secondary electrode 18b. Further, the electrodes 19a and 19b are spaced apart on the element 15 to mirror the arrangement of the transmit electrodes 18*a* and 18*b*. The primary and secondary receive electrodes 19*a*, 19*b* share a common ground electrode G which is mounted on the opposite face of the piezoelectric element 15 adjacent the pipe 4.

The primary receive electrode 19*a* is connected to a specific matching circuit 13*a* which is in turn connected to a signal amplifier 22*a*. The secondary receive electrode 19*b* is connected to a specific matching circuit 22*b* which is in turn connected to a signal amplifier 22*b*.

An electronic switch 21 operably connects the output of each of the signal amplifiers 22*a*, 22*b* with the COFDM demodulator 11, and may effect a connection such that the COFDM demodulator communicates with one or the other of the electrodes 19*a* or 19*b*.

The COFDM demodulator 11 has a nominal centre frequency of 3.5 MHz.

The operation of the dual-electrode transducer arrangement shown in FIG. 2 will now be described. The operation of the single-electrode transducer arrangement in FIG. 1 will be readily understood from this description and as such, the operation of the single-electrode transducer need not be further described.

In operation a signal 7 to be transmitted is input to the transducer 100 as a 14.4 kbps physical layer data. The signal 7 is processed at the COFDM modulator 10 where a COFDM modulation scheme is applied which uses binary phase shift keying (BPSK) symbol mapping. Other symbol mapping algorithms may be employed within the scope of the invention.

In particular, the COFDM modulation scheme is based on the use of 256 carriers spaced at intervals of 152.58 Hz, giving a frequency bandwidth of 39 kHz. Where a ½ rate Forward Error Correction algorithm and a ⅛$^{th}$ guard period are further provided, such provision should lead to a logical channel data rate of 19.5 kbps with a latency of at least 6.55 ms, not including additional direct time of flight and the electronic signal processing delays.

The signals output from the COFDM modulator 10 are fed into an electronic switch 20. Depending on the condition of the electronic switch 20, the COFDM output will be input to either the matching circuit 12*a* or 12*b*. In FIG. 2, the electronic switch 20 is shown in a condition such that the COFDM output is fed into matching circuit 12*a*.

The signals output from the selected matching circuit, in this instance circuit 12*a*, are passed from the matching circuit to the corresponding electrode, in this instance electrode 18*a*. At the electrode, the signals energise the piezoelectric element 14 to provide a source of acoustic pressure waves, or the acoustic aperture.

The acoustic waves 8 thus generated propagate through the plate 16, then through the fluid 3, and then through the wall 4. A portion of the waves 8 strike the piezoelectric element 15. At each interface $I_{IM}$, $I_{MF}$, $I_{FW}$ and $I_{WO}$ a proportion of the energy of the waves 8 is reflected.

The piezoelectric elements tend to produce longitudinal waves. Although longitudinal acoustic waves cannot be transmitted across a liquid solid interface at angles greater than a critical angle (e.g. ~15° for a water to steel interface), acoustic mode conversion of the incident longitudinal wave at the interface can result in shear waves being transmitted. Subsequent mode conversion within further interfaces can result in the regeneration of a longitudinal polarised wave propagating onto the receiving piezoelectric element.

The portion of the longitudinal waves 8 striking the piezoelectric element 15 effect an electric signal at the element 15 which is transferred through electrodes 19*a*, 19*b* to the corresponding matching circuits 13*a*, 13*b*.

However, as a result of the reflections at the interfaces, a number of signals may be observed at the piezoelectric element 15. For example 'multi-path' signals occur as the waves pass $I_{IM}$ to $I_{MF}$, $I_{MF}$ to $I_{IM}$ and then on to the piezoelectric element 15. Such a multi-path signal is referred to as the triple transit signal in the plate.

Further multi-path signals are generated as the waves pass $I_{IM}$ to $I_{MF}$, $I_{MF}$ to $I_{IM}$, $I_{IM}$ to $I_{MF}$, $I_{MF}$ to $I_{IM}$ and then onward to the piezoelectric element 15. Such signals are referred to as the fifth transit signal in the plate.

Another notable multipath signal occurs as the waves pass $I_{IM}$ to $I_{WO}$, $I_{WO}$ to $I_{FW}$ and then onwards to the piezoelectric element 15. Such signals are referred to as the triple transit signal in the wall.

A further notable multipath signal occurs as waves pass $I_{MF}$ to $I_{FW}$, $I_{FW}$ to $I_{MF}$ and then onwards to the piezoelectric element 15. Such signals are referred to as the triple transit signal in the fluid.

Each multipath signal arrives at the receive piezoelectric transducer 200 at a different time depending on the respective path length.

The arrival of such multi-path signals at the receive piezoelectric element 15 is used to provide further confirmation that a signal has been sent by the transmit transducer 100. Where the transducers 100 and 200 are misaligned, the system, if using for example a COFDM scheme, may rely on the arrival of these multi-path signals to provide this confirmation. Thus the multi-path signals can tend to increase the amount of misalignment that can be tolerated.

Upon their arrival at the piezoelectric element 15 of the receive transducer 200, the piezoelectric element 15 converts the acoustic signals 8 to an electric signal at the electrodes 19*a* and 19*b*.

Depending on the condition of the electronic switch 21, either the electrode 19*a* or the electrode 19*b* relays the electric signal from the piezoelectric element 15 to their respective matching circuit and onwards to the COFDM demodulator 11.

The signal output from the matching circuit is then fed into a signal amplifier and onwards to the COFDM demodulator 11, which outputs data 7'. The data 7' is an estimate of the original physical layer input 7.

In an implemented embodiment of the invention, each of the first/primary transmit electrode 18*a* and the first/primary receive electrode 19*a* is a thin 3.2 mm×3.2 mm square of copper nickel; each of the second/secondary transmit and receive electrodes 19*b* and 18*b* is a thin 2.7 mm×2.7 mm square of copper nickel; each of the piezoelectric elements 14 and 15 is a 0.5 mm thick plate of PIC 151 grade PZT (available from PI Ceramics GmbH, Lindenstrasse, 07589 Lederhose, Germany; www.piceramic.com) with width and breadth of 14.4 mm and 13.2 mm respectively. The ground electrodes G are formed by metalizing the piezoelectric element with a copper nickel layer. There is provided a metalized track of copper nickel extending from the ground electrode G to the opposite face (i.e. the face bearing the primary electrode) of the respective piezoelectric element 14 and connected to an electrical ground.

The matching circuit associated with each electrode is tuned for use with the particular electrode and its surrounding electrical components. For example, in the matching circuit 12*a* associated with the primary transmit electrode 18*a*, these components would be the electronic switch 20 and the modulator 10. FIGS. 10 to 13 show the circuit diagrams for each of these matching circuits.

At the transmit transducer 100, the 3.2 mm×3.2 mm primary electrode 18*a*, in the absence of impedance matching, would have an impedance of approximately 43Ω at 3 MHz. Thus the particular matching circuit 12*a* that yields the widest frequency bandwidth return loss of better than ~2:1 Voltage Standing Wave Ratio (VSWR) may be determined. The applicant found that the matching circuit 12*a* shown in FIG. 10 was suitable.

Thus in the implemented embodiment the matching circuit 12*a* has a 1.5:1 turn ratio RF transformer 42 which transforms the source impedance from 50Ω to 75Ω. A 22 µH shunt inductor 44 followed by a 6.8 µH series inductor 46 are connected between the transformer 42 and the primary transmit electrode 18*a*. The 2:1 VSWR bandwidth of this tuned transducer was ~1 MHz centred on ~3.2 MHz. This matching strategy provides a wider frequency bandwidth electrical match for the transducer than could be achieved using a single series tuning inductor alone.

At the transmit transducer 100, the 2.7 mm×2.7 mm secondary electrode 18*b*, in the absence of impedance matching, would have an impedance of approximately 60Ω at 3 MHz. Thus the matching circuit 12*b* that yielded the widest frequency bandwidth return loss of better than ~2.1 VSWR may be determined. The applicant found in practice that the matching circuit 12*b* shown in FIG. 11 was suitable. This matching circuit has a 3:1 turn ratio RF transformer 52 which transforms the source impedance from 50Ω to 150Ω. A 10 µH series inductor 56 followed by a 22 µH shunt inductor 54 across the electrode 18*b* are connected between the transformer 52 and the electrode 18*b*. The 2:1 VSWR bandwidth of this electrically tuned transducer was ~1 MHz centred on ~3.5 MHz.

At the receiver transducer 200, the matching circuit 13*a* interconnects the 3.2 mm×3.2 mm primary electrode 19*a* and the signal amplifier 22*a*. The impedance of the 3.2 mm×3.2 mm electrode 19*a* is the same as that for the 3.2 mm×3.2 mm primary transmit electrode 18*a*. As such, but for the removal of a transformer and the addition of a resistor, the receive matching circuit 13*a* is similar to the transmit matching circuit 12*a*. In particular the matching circuit comprises a 6.8 µH series inductance 62 followed by a 22 µH shunt inductance 64 followed by a 75Ω shunt resistance 66.

At the receiver transducer 200, the matching circuit 13*b* interconnects the 2.7 mm×2.7 mm secondary electrode 19*b* and the signal amplifier 22*b*. The impedance of the 2.7 mm×2.7 mm secondary electrode 19*b* is the same as that for the 2.7 mm×2.7 mm secondary transmit electrode 18*b*. In particular the matching circuit 13*b* comprises a 22 µH shunt inductance 72 followed by a 10 µH series inductance 74 followed by a 150Ω shunt resistance 76.

In the implemented embodiment, a reflection loss of ~9.3 dB (this value varying with the temperature and pressure of the surrounding fluid 3) was observed at the $I_{MF}$ interface.

For an equivalent transducer mounted on the outer side of a plate (i.e. at interface equivalent to $I_{MF}$) and encapsulated within an adhesive layer, the minimum coupling loss of acoustic power from a piezoelectric element into the fluid 3 would be expected to be approximately 10 dB, but this coupling would show a large variation over the 2:1 VSWR frequency bandwidth of the transducer. Indeed, coupling losses may range from approximately 10 dB to 16 dB.

Consequently the overall efficiency for coupling power from a transducer to a fluid medium (e.g. a liquid within a liquid-carrying pipe), through a fluid medium and then into a solid medium (e.g. the pipe wall) can be superior using such a plate 16 arrangement as compared to coupling power directly from a piezoelectric element 14 (and any low acoustic impedance protective coating such as a paint or adhesive) into the fluid.

The loss budget for signal transmission from the transmit transducer electrodes 18*a* or 18*b* on the piezoelectric element 14 to the corresponding transducers electrodes 19*a* or 19*b* on the piezoelectric element 15 will be a function of various parameters. These include the separation of the transmitter and receiver piezoelectric elements, the thickness of the pipe wall 4, the thickness of the mounting plate 16, the attenuation of the fluid medium 2, the size of the transducer electrodes, and the misalignment of the transducers. In the implemented embodiment, the distance between the piezoelectric transducer 14 and the inner surface of the pipe wall 4 was approximately 100 mm; the thickness of the pipe wall was approximately 25 mm; the thickness of the mounting plate 16 was approximately 10 mm. As such, in the implemented embodiment the estimated signal transmission loss was ~49 dB when the transducer piezoelectric elements 14 and 15 are directly aligned. The contributions to this loss budget were accounted for by: ~26 dB acoustic spreading losses due to diffraction from a 2.7 mm electrode; ~18.6 dB total reflection losses at the two steel-seawater interfaces; ~4 dB total electromechanical conversion losses by the two transducers; ~0.3 dB acoustic attenuation losses at ~3 MHz.

As represented in FIGS. 3 and 4, the alignment between a receiving transducer 200 and a transmitting transducer 100 may vary i.e. in general the transducers will be fixed in a misaligned condition but the actual misalignment is difficult to predict. This misalignment may arise because in general the transmit transducer 100 will be attached to an object within the fluid which, though fixed into a position, may not be fixed with the precision necessary to align the transducers. A misalignment may also occur where an unexpected obstruction prevents mounting the transducers at the exact intended position.

In FIGS. 3 and 4, ray-tracing diagrams (not to scale) are illustrated for a computer-simulated transmitting transducer having a 2.7 mm×2.7 mm electrode. The transducer 100 was modelled as mounted within an approximately 500 mm outer diameter steel pipe 4 (of thickness 10 mm) and transmitting to a receiving transducer 200 mounted on the outside of the pipe 4. The stand-off distance between the piezoelectric layer of the transmitting transducer and the internal diameter of the pipe 4 is approximately 100 mm. The steel pipe 4 is filled with the test fluid 2 and as such surrounds the transmitting transducer 100. These ray-tracing simulations did not simulate the COFDM communications scheme implemented by the signal processing module 10, or multipath signals.

The continuous lines extending from the transmit transducer 100 represent angular loci at which the intensity of the acoustic signal falls to zero. The dashed lines extending from the transmit transducer 100 represent the angular loci at which the intensity is ~3.9 dB less than the peak response.

The simulations have shown for the 2.7 mm electrode that any angular misalignment greater than 4° (angular misalignment about the centre of the pipe) will therefore cause a drop in received signal intensity of more than ~3.9 dB. If the electrode were mounted at the centre of the pipe, this field of view would rise to ~5.3°.

FIG. 5 shows the applicant's experimental impulse response results for a test rig where a transmit transducer 100 was positioned at eight different alignments with a receive transducer 200. For each different alignment, a Bit Error Rate (BER) has been determined and the maximum peak to peak voltage of the response is recorded; no Forward Error Correction algorithms were applied during the experiment.

Representations of the transducers used in the test rig are shown in FIGS. 8 and 9. The test rig was set up generally according to FIG. 6, with the transmit transducer 100 mounted, relative to the receive transducer 200, at a variety of alignments (a-h as shown in FIG. 6) on the external surface of an inner pipe 6 and the receive transducer mounted on the external surface of an outer pipe 4.

For each alignment/site an impulse, in this case a square pulse wave of 100 ns duration, was transmitted by the transmit transducer. The signal received at the receive transducer for each of the transmitter transducer sites is shown over an initial 500 µs period.

For example FIG. 5a shows the response at the receiver 200 when there is 0° radial misalignment and 0 mm axial/vertical offset (vertical in respect of the arrangement shown in FIG. 6), the response having a BER of 0 and a peak-to-peak voltage of 1.7773 V. FIG. 5f shows the response where the transmit transducer 100 is axially/vertically offset 50 mm above the receive transducer 200 and has a 16° radial misalignment, the response having a 0.0171 BER and a peak-to-peak voltage of 0.0156 V.

The complexity of the response increases with misalignment; however it can be seen that for each of the misalignments in the range assessed here, the peak-to-peak voltage is sufficiently pronounced in the 500 µs timeframe to enable symbol detection by employing known signal processing methods.

No error correction algorithms were implemented in the test rig, but a BER of less than 0.1 should be compensable by applying a half rate Forward Error Correction (FEC) to the transmitted signal. Thus, the invention would provide FEC in order to compensate for the BER. The FEC may be applied to the data being fed into the COFDM modulator 10, or may be implemented within the COFDM modulator itself (e.g. the processor implementing the COFDM modulation may also implement the FEC)

A device, shown in FIG. 7, for monitoring remotely the conditions in a vessel comprises an array 420 of internal transceivers 400 and an external transceiver 500.

As shown in FIG. 8 each transceiver 400 comprises a dual-electrode receive transducer 102 and a dual-electrode transmit transducer 100.

The array 420 is mounted on an inner pipe 6 fixed within a larger pipe or conduit 4 carrying fluid 2. Each transceiver 400 in the array 420 is operably connected to a common sensor or set of sensors 600 which for example monitor a physical parameter of the fluid flow in the pipe 4 and output a suitable electrical signal to all array transceivers 400.

In order to maintain a de-cluttered diagram in FIG. 7, the connections between the sensor 600 and the array transceivers 400 are shown only in respect of the top row of the array 420, in practice connections would exist between each array transceiver 400 and the sensor 600.

Using dual-electrode transducers according to the implemented embodiment, and as shown in FIG. 2, each transceiver can transmit information of a sufficient quality to be received over a ±28° radial misalignment.

Thus by providing three transceivers spaced radially over the surface of the inner pipe at 56° intervals, the array would provide an approximate 180° field of view. Thus a single receive transducer at the external pipe, intended for placement at the centre of the array field of view, could tolerate a misalignment of approximately ±90° before all possible communications links between the array 420 and the external transceiver 500 break down.

The device shown in FIG. 7 provides a row consisting of four radially spaced transceivers 400, which could provide a 225° field of view.

As shown in FIG. 9, the device comprises an external transceiver 500 having a dual-electrode transmit transducer 201 and dual-electrode receive transducer 200. The external transceiver 500 is operably connected to a control unit 700 which may further relay the sensor data or signals derived therefrom. For example the control unit 700 may relay a command signal to an actuator (not shown).

In operation, the device may undergo a calibration process in order to determine which transceiver unit 400 in the array 420 is best situated to transmit a signal to the external transceiver unit 500.

For example, upon initiation of a calibration process, each transmit electrode 18a, 18b of each transceiver unit 400 may take it in turns to transmit a calibration signal for a given period. Provided that the sequence and period in which the electrodes transmit this signal is known by the external transceiver 500, the transceiver 500 may determine the internal transceiver unit 400 and the electrode (18a or 18b) from which it receives the strongest signal.

According to need, the device may also determine the relative position of the external transceiver; for example whether the transceiver is positioned as shown at 500 or as shown at 500'.

The external transceiver 500 may then use the co-located transmit transducer 201 to send a message to the array 420, the message identifying the internal transceiver 400 with the best link to the external transducer 500.

The array 420 may then temporarily be deactivated, save for the best-link internal transducer unit, and thus save energy.

Processors may be provided at the internal and external transceivers to appropriately execute this calibration process and communicate with associated electronic switches. Alternatively, the processor implementing the COFDM modulation may be configured to additionally execute the calibration.

Once the link is established, the identified internal transceiver 400 and the particular electrode therein may transmit acoustic waves representing the processed sensor data 7 to the external transceiver 500. The external transceiver may then reconstruct the sensor data (i.e. an estimate thereof 7') and relay it to the control unit 700. The control unit 700 can analyze the sensor data 7' and interact as necessary with further equipment. For example, if the device is for regulating the temperature of liquid 3 in vessel 4, then the control unit 700 may be interfaced with a heating and cooling means (not shown) which may be activated depending on sensor data relating to temperature.

The internal transceivers 400 and the sensor unit 6 would be provided with a power supply such as a battery (not shown). Alternatively, where the internal transceivers are placed in flowing fluid, the transceivers 400 could be powered by a generator comprising a turbine for drawing energy from the ambient flow.

An implemented embodiment of an internal transceiver 400, shown in FIG. 8, has a dual-electrode transducer 100, as described above, configured to transmit data. The first transmit transducer 100 has a 3.2 mm×3.2 mm electrode 18a and a 2.7 mm×2.7 mm electrode 18b.

The internal transceiver 400 also has a dual-electrode receiver transducer 102, which is adjacent the dual-electrode transducer 100. The receiver transducer 102 has a 3.2 mm×3.2 mm electrode and a 2.7 mm×2.7 mm electrode.

The internal transceiver 400 is shown in FIG. 8 in an unencapsulated condition. However, where the transceiver 400 may be submerged in an electrically conductive or corrosive surrounding environment, e.g. if the vessel carries seawater, the transceiver should be suitably encapsulated. Encapsulation may be effected by wrapping the transceiver in flexible plastics material.

Alternatively, the encapsulation could be effected by providing a housing surrounding the transceiver, in which case, the substrate 16 may be integrated into the housing.

Corresponding with the internal transceivers 400, the external transceiver 500, shown in FIG. 9, is provided with a dual-electrode receive transducer 200 with a 3.2 mm electrode 19a, and a 2.7 mm electrode 19b. Further, the external transceiver 500 is provided with a dual-electrode transmit transducer 201 with a 3.2 mm and a 2.7 mm electrode. As with the internal transceiver 400, the smaller electrodes 2.7 mm are provided with a matching circuit equivalent to that described above in respect of the internal transceiver 400.

By providing two different sizes of electrode, the device may choose whichever electrode provides the strongest and/or simplest signal to the receive transducer that yields the lowest bit error rate prior to any FEC. Where two electrode sizes are at each transceiver the selection of the optimum element may be undertaken as part of the array calibration process.

Analysis of the impulse response traces such as those shown in FIGS. 5a-h has shown that the evolution of the multi-path transmission signal with axial angular or vertical misalignments as illustrated in FIG. 6 is complex; these multi-path transmission signals arise from different combinations of multiple reflections off the various possible interfaces $I_{IM}$, $I_{FM}$, $I_{FW}$ and $I_{WO}$ shown in FIG. 1. The complexity of the received signal in response to an input pulse can vary greatly with the size of the transducer electrode as illustrated for example in FIGS. 14a and 14b. In this specific case, recorded on the experimental test rig of the implemented embodiment, the larger aperture electrodes 18b, 19b, which have the smaller angular field of view, produce the less complex multi-path transmission response. Consequently the electrode pair with the lowest bit error rate (prior to any Forward Error Correction) can vary as the radial or axial/vertical misalignment is changed.

Surprisingly, the presence of multipath signals tends to facilitate successful operation of this invention as these signals greatly extend the axial angular and vertical misalignments between the transducer assemblies 100 and 200 over which signal transmission can be achieved.

As shown in FIG. 9, the external transceiver is mounted onto an outer surface of pipe 4 which has been machined so as to provide a suitably flat surface for mounting the transceiver. Depending on the environment into which the transceiver 500 is to be deployed, encapsulation may be provided.

At each transducer, the signal processing requirements, such as the COFDM modulator, could be met by providing a suitable processor. Once such suitable processor would be the ARM9 core multimedia processor (available from ARM ltd., 110 Fulbourn Road, Cambridge, UK; www.arm.com) which would allow the various computationally intensive digital signal processing functions necessary to support COFDM (e.g. Fast Fourier Transform, Inverse Fourier Transform, Forward Error Correction, and Filtering) to be implemented in real time. Further, the ARM9 core has relatively low power requirements.

In the implemented embodiment, the substrate 16 is fabricated as a steel plate. As such the piezoelectric element is bonded to the substrate using a two part epoxy resin (for example 'EP30' as supplied by MasterBond Inc of 154 Hobart Street Hackensack, N.J., USA; www.masterbond.com).

The transmit matching circuits, are implemented on printed circuit boards (PCBs) and such circuit boards are bonded to the substrate using a two part silver loaded epoxy (for example the two-part silver loaded epoxy may be 'A501 Two-Part Conductive' as supplied by Johnson Matthey plc of $5^{th}$ Floor, 25 Farringdon Street, London, UK EC4A 4AB; www.matthey.com).

As an alternative to the dual-electrode transducers 100 and 200, a transducer may be provided with three or more electrodes.

Further, an array of electrodes may be mounted on a piezoelectric element. Each electrode so mounted would be capable of forming an acoustic aperture at the associated piezoelectric element to which they are mounted.

Where such an array of electrodes is provided, the transducer may employ a more complex selection/activation scheme to identify a suitable electrode or combination thereof to provide the communications link.

Indeed, where such an array of electrodes is provided, each may be individually activated by a specific modulation of the phase and amplitude of the signal. Thus, or otherwise, the array may be configured to function as an acoustic beam steering device.

In the embodiments described above, the acoustic aperture device is provided by the combination of the electrode and the piezoelectric element to which it is mounted. In some of the embodiments described above, a plurality of acoustic aperture devices is provided. In the embodiment shown in FIG. 2, a plurality of acoustic aperture devices is provided within the single transducer. In the transducers of FIG. 7, a plurality of acoustic aperture devices is provided by not only the plurality of electrodes at the piezoelectric element within the transducer, but also by having a plurality of transducers. Where the acoustic aperture devices are arranged in an array, the scheme for controlling their activation may be applied regardless of whether the array exists wholly within a single transducer or whether the array is formed by an array of transducers. Thus the skilled man would understand that any discussion above of beam shaping in respect of an array of electrodes, could apply to an array of transducers also; both may be considered to have an array of acoustic apertures.

As discussed above, the applicant has observed that mode conversion of longitudinal waves to and from other acoustic modes can permit the transmission of data, carried initially by longitudinal acoustic waves from a fluid medium to a solid medium, at surprisingly large angles of incidence. In order to exploit this effect, the substrate may be formed so as to promote appropriate acoustic wave mode conversion. The particular form may vary with the expected misalignment range and/or media combination; however contemplated ways of promoting such mode conversion include curving one or both surfaces of the substrate, providing a domed (convex or concave) form at the substrate, and/or providing the substrate with surface relief patterning (which may or may not be periodic).

The invention claimed is:

1. A transducer for acoustic communications, the transducer comprising:

a signal processor configured to implement a communications scheme at and around a centre frequency of at least 1 MHz;

a piezoelectric element for activation in accord with the communications scheme;

an electrode electrically connected to the signal processor, and having a first surface that runs along and is attached to a second surface of the piezoelectric element; and a substrate, having the piezoelectric element mounted on the substrate;

wherein a length of the first surface of the electrode that runs along the second surface of the piezoelectric element is approximately equal to the acoustic wavelength of an acoustic wave in the substrate at the centre frequency, the transducer being adapted for acoustic communications through a series arrangement of fluid and solid media.

2. The transducer according to claim 1 wherein the communications scheme is a Coded Orthogonal Frequency Division Multiplexing (COFDM) scheme.

3. The transducer according to claim 2 wherein the substrate is shaped to promote acoustic wave mode conversion.

4. The transducer according to claim 1 wherein the signal process is configured to implement a signal generator, the transducer further comprising a matching circuit electrically interposed between the signal generator and the piezoelectric element.

5. The transducer according to claim 4 wherein the electrically matched piezoelectric element has an electrical impedance equal to or less than 200Ω.

6. The transducer according to claim 5 wherein the piezoelectric element has a relative permittivity of at least 1000.

7. The transducer according to claim 1 wherein the electrode has an area in the region of 4 mm$^2$-16 mm$^2$.

8. The transducer according to claim 1 wherein the substrate has a thickness such that the thickness does not represent an integer ratio of other wall thicknesses in the transducer or solid medium, the thickness thereby mitigating the interference from low-order multi-path signals.

9. The transducer according to claim 1 further comprising:
a secondary electrode; and
a switch operably connected between the signal processor, the electrode, and the secondary electrode;
wherein the switch is operable to select the electrode with which the signal processor communicates.

10. The transducer according to claim 9 wherein the secondary electrode is of substantially different dimensions to another electrode of the transducer.

11. A remote monitoring device for a vessel, the vessel defining a cavity for carrying or storing fluid, the remote monitoring device comprising:
a first transducer according to claim 1 mounted within the cavity and operable to transmit an acoustic wave;
a second transducer mounted on an external surface of the vessel and operable to receive an acoustic wave, the second transducer being substantially aligned with the first transducer;
a power supply unit electrically connected to the first transducer; and
a sensor within the cavity and electrically connected to the first transducer.

12. The remote monitoring device for a vessel according to claim 11 comprising further first transducers mounted within the cavity to provide an internal array of transducers.

13. The remote monitoring device for a vessel according to claim 12 wherein the internal array extends over a mounting surface such that the array may communicate with a receive transducer located within a predetermined region on the vessel, and wherein the device further comprises an internal member, the internal member providing the mounting surface for the internal array.

14. The remote monitoring device for a vessel according to claim 12 wherein the internal array extends over a mounting surface such that the array may communicate with a receive transducer located within a predetermined region on the vessel.

15. The remote monitoring device for a vessel according to claim 11 comprising further second transducers mounted at an external surface of the vessel to provide an external array of transducers.

16. The remote monitoring device for a vessel according to claim 11 wherein the power supply comprises a generator comprising a turbine for drawing energy from an ambient fluid flow.

17. The remote monitoring device for a vessel according to claim 11 wherein the first transducer is co-located with a transducer operable to receive an acoustic wave, thereby defining an internal transceiver and the second transducer is co-located with a transducer operable to transmit an acoustic wave thereby defining an external transceiver.

18. The remote monitoring device for a vessel according to claim 11 wherein the first transducer and the second transducer are each provided with a primary and a secondary electrode, the secondary electrodes being the same size as each other.

19. The remote monitoring device for a vessel according to claim 11, wherein the first transducer and the second transducer are each provided with a primary and a secondary electrode, the secondary electrodes being differently sized than the primary electrodes.

20. A method of communicating between an internal surface of a vessel and an external surface of the vessel, the vessel defining a cavity, the method comprising the steps of:
providing a first transducer within the cavity, the first transducer comprising:
a signal processor configured to implement a communications scheme at and around a centre frequency of at least 1 MHz;
a piezoelectric element for activation in accord with the communications scheme;
an electrode electrically connected to the signal processor, and having a first surface that runs along and is attached to a second surface of the piezoelectric element; and
a substrate, having the piezoelectric element mounted on the substrate, wherein a length of the first surface of the electrode that runs along the second surface of the piezoelectric element is approximately equal to the acoustic wavelength of an acoustic wave in the substrate at the centre frequency;
providing a receive transducer on the external surface of the vessel;
receiving a sensor signal at the first transducer;
digitally modulating the signal at the signal processor to provide a data stream;
transmitting the data stream using acoustic waves;
receiving the parallel data streams at the receive transducer;
combining the parallel data streams into a data stream; and
de-modulating the data to extract the sensor signal.

21. The method of communicating between an internal surface of a vessel and an external surface of the vessel, according to claim 20, wherein digitally modulating the signal comprises implementation of a COFDM modulation scheme.

* * * * *